United States Patent
Grant

(10) Patent No.: US 8,445,939 B2
(45) Date of Patent: May 21, 2013

(54) METHOD OF FORMING A SEMICONDUCTOR DEVICE AND SEMICONDUCTOR DEVICE

(75) Inventor: John M. Grant, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/316,736

(22) Filed: Dec. 12, 2011

(65) Prior Publication Data

US 2012/0080720 A1  Apr. 5, 2012

Related U.S. Application Data

(62) Division of application No. 12/296,626, filed as application No. PCT/EP2006/004943 on Apr. 11, 2006, now Pat. No. 8,076,189.

(51) Int. Cl.
*H01L 29/66* (2006.01)

(52) U.S. Cl.
USPC ........... 257/192; 257/336; 257/341; 438/197; 438/300; 438/303; 438/305

(58) Field of Classification Search
None
See application file for complete search history.

(56) References Cited

U.S. PATENT DOCUMENTS

| | | | |
|---|---|---|---|
| 6,274,894 B1 | 8/2001 | Wieczorek et al. | |
| 6,372,583 B1 | 4/2002 | Tyagi | |
| 6,861,318 B2 | 3/2005 | Murthy et al. | |
| 6,885,084 B2 | 4/2005 | Murthy et al. | |
| 7,112,495 B2 | 9/2006 | Ko et al. | |
| 8,062,946 B2 | 11/2011 | Yeo et al. | |
| 2003/0080361 A1 | 5/2003 | Murthy et al. | |
| 2003/0132487 A1 | 7/2003 | Cabral, Jr. et al. | |
| 2005/0012146 A1* | 1/2005 | Murthy et al. | 257/336 |
| 2005/0082522 A1 | 4/2005 | Huang et al. | |
| 2005/0087824 A1 | 4/2005 | Cabral, Jr. et al. | |
| 2005/0090082 A1 | 4/2005 | Sridhar et al. | |
| 2005/0110082 A1 | 5/2005 | Cheng et al. | |
| 2005/0280098 A1 | 12/2005 | Shin et al. | |
| 2005/0285203 A1 | 12/2005 | Fukutome et al. | |
| 2006/0009001 A1* | 1/2006 | Huang et al. | 438/305 |
| 2006/0035449 A1 | 2/2006 | Yoo | |
| 2006/0065937 A1 | 3/2006 | Hoffmann et al. | |
| 2006/0172511 A1 | 8/2006 | Kammler et al. | |
| 2006/0202234 A1* | 9/2006 | Hara | 257/213 |

FOREIGN PATENT DOCUMENTS

| | | |
|---|---|---|
| JP | 2006060222 A | 3/2006 |
| WO | 0169668 A | 9/2001 |

* cited by examiner

*Primary Examiner* — Kyoung Lee

(57) ABSTRACT

A method of forming a semiconductor device comprises forming a control electrode over a portion of a semiconductor layer, forming recesses extending into the semiconductor layer on opposing sides of the control electrode, and forming doped regions in the semiconductor layer through the recesses. The doped regions form current electrode regions of the semiconductor device and each doped region extends into the semiconductor layer from at least a base of a recess. The method further comprises forming, after forming the doped regions, strained semiconductor regions in the recesses, wherein a junction between each doped region and the semiconductor layer is formed below an interface between a strained semiconductor region and the semiconductor layer.

20 Claims, 7 Drawing Sheets

METHOD OF FORMING A SEMICONDUCTOR DEVICE AND SEMICONDUCTOR DEVICE

CROSS-REFERENCE TO RELATED APPLICATION(S)

This application is a divisional of U.S. patent application Ser. No. 12/296,626, entitled "METHOD OF FORMING A SEMICONDUCTOR DEVICE AND SEMICONDUCTOR DEVICE," filed on Oct. 9, 2008, which is a National Stage Entry under 37 C.F.R. §371 of PCT/EP06/04943, filed Apr. 11, 2006, the disclosures of which are hereby expressly incorporated by reference in their entirety.

FIELD OF THE DISCLOSURE

This invention relates to a method of forming a semiconductor device and a semiconductor device. More particularly, this invention relates to improving semiconductor device performance with the use of strain engineering.

BACKGROUND

Advances in semiconductor device fabrication processes have led to scaling of device dimensions which has resulted in improvements in device performance and cost. For CMOS transistor devices, after significant scaling over the years, due to limitations in gate-oxide thickness and source/drain (S/D) junction depth, it appears that the scaling limit is being approached, where more shrinking will not boost performance because of leakage, power dissipation and tunneling effects. Thus, techniques, other than scaling, are being considered in order to maintain and/or improve device performance for smaller device sizes. Strain engineering is one such technique.

Strain engineering involves straining of the semiconductor crystal to increase the mobility of charge carriers in the channel (electrons in N-channel MOSFET (NMOS) devices and holes in P-channel MOSFET (PMOS) devices). Device performance may be improved with enhanced carrier mobility. Compressive strain is induced in silicon-based PMOS devices, typically using epitaxially grown silicon and germanium SiGe in the source and drain regions of the device. This is known as a source/drain stressor structure. In silicon-based NMOS devices, a tensile strain is used. By adding stress to a channel of a transistor, the carrier mobility in the channel is enhanced which increases the drive current of the transistor but without impacting negatively other device parameters such as off-state leakage.

In a conventional process flow to fabricate a source/drain stressor structure in a transistor device, as shown for example in U.S. Pat. No. 6,861,318, the source/drain recesses are etched in a silicon substrate to the desired depth of the stressor structure and material, typically SiGe, is epitaxially deposited in the etched recesses. The epitaxially deposited material may be doped in-situ (in other words, the strained material includes a dopant in addition to silicon and germanium), while in other cases the deposited SiGe is implanted with dopants which are then activated using a thermal anneal process.

A disadvantage to using the SiGe S/D stressor structure for general purpose or low power applications (for example, in battery operated applications such as mobile devices) is that the SiGe as a material has inherently higher junction leakage than silicon and in many cases defects are formed at the interface between the SiGe and the silicon substrate that also can form leakage paths through the junction. This may result in power being wasted due to junction leakage.

There is therefore a need to provide a semiconductor device which uses strain engineering but which attempts to reduce junction leakage.

SUMMARY

The present invention provides a method of forming a semiconductor device and a semiconductor device as described in the accompanying claims.

BRIEF DESCRIPTION OF THE DRAWINGS

A semiconductor device and a method of forming a semiconductor device in accordance with the present invention will now be described, by way of example only, with reference to the accompanying drawings in which.

DETAILED DESCRIPTION OF THE DRAWINGS

In the description that follows and in FIGS. 1-12, certain regions/layers are identified as being of a particular material, conductivity and/or type. However, this is merely for convenience of explanation and not intended to be limiting. Those of skill in the art will understand based on the description given herein that various semiconductor materials can be used and that the doping of various regions of the device may be altered in order to obtain different device functions. Note, the Figures are not drawn to scale.

The present invention will be described with reference to a semiconductor device comprising a planar silicon-based PMOS device. It will be appreciated that the invention is not limited to a planar silicon-based PMOS device and applies equally to other semiconductor devices, such as NMOS device, III-V semiconductor-based device, or non-planar device such as a FinFET device or similar devices.

A known process for forming a PMOS device having a S/D stressor structure will now be described with reference to FIGS. 1-4.

Figure 1:
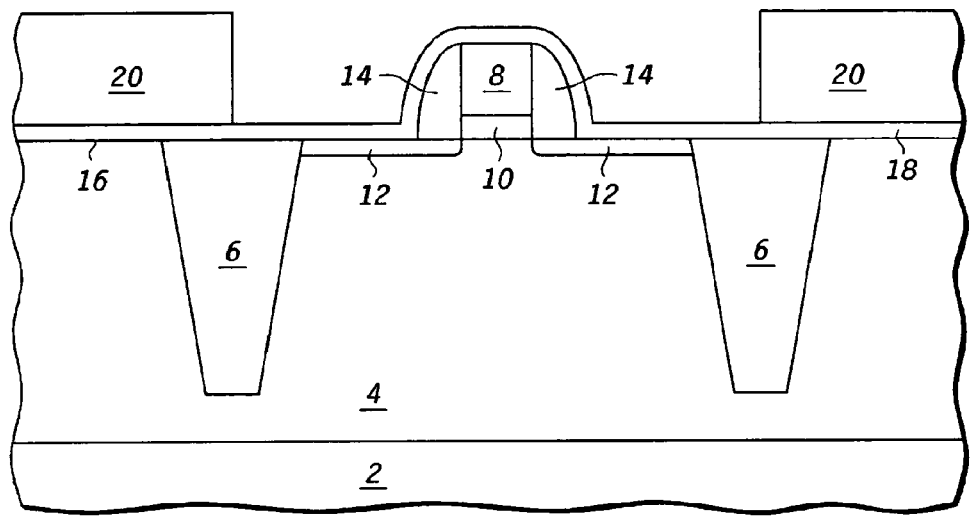
FIGS. 1-4 are cross-sectional side views of part of a semiconductor device during different stages of manufacture.

FIG. 1 shows a partially manufactured PMOS device on an integrated circuit comprising an epitaxial silicon layer 4 formed on a substrate 2, isolation regions 6 (e.g. oxide isolation regions) formed in the epitaxial silicon layer 4 to isolate wells of different conductivity types and to isolate adjacent transistors and a gate electrode 8 formed on a gate dielectric layer 10. The gate electrode may be a polysilicon electrode and the gate dielectric layer 10 may be a nitrided oxide layer. Lightly doped or doped shallow regions 12 are formed in the epitaxial silicon layer 4 and are located on opposing sides of the gate electrode 8. These regions 12 are also known as lightly doped drain regions (in fact a region 12 on one side of the gate electrode 8 is a lightly doped source region and a region 12 on the other side is a lightly doped drain region) or extension regions. For PMOS device, the dopant for regions 12 may be boron. Spacers 14 are formed on opposing sides of the gate electrode 8. The spacers 14 cover the sides of the gate electrode 8 and portions of a surface 16 of the epitaxial silicon layer 4. The spacers 14 may be nitride spacers. A hard mask 18, such as a 20 nm oxide mask formed by PECVD, is then formed over the semiconductor device and photoresist 20 is then formed over the other non-PMOS devices on the integrated circuit.

Figure 2:
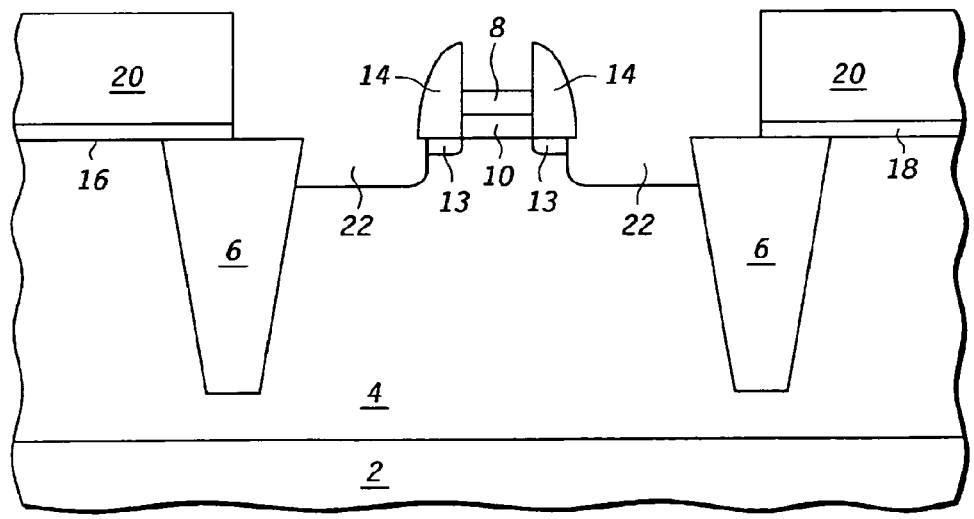

FIG. 2 shows the structure of FIG. 1 after a selective etch step. An anisotropic etchant is used which selectively removes the hard mask 18 and the epitaxial silicon layer 4 which are not covered with photoresist 20 to form recesses 22 on opposing sides of the gate electrode 8. The gate electrode 8 is also etched. In other process flows, a mask is used over the gate such that the gate electrode 8 is not etched. The recesses extend about 65 nm from the surface 16 into the epitaxial silicon layer 4. Inner edges of the recesses undercut the outer edges of the spacers 14 and outer edges of the recesses are aligned with the isolation regions 6. The exposed portion of lightly doped drain regions 12 are also etched in the selective etch step to provide lightly doped drain (and source) regions 13 and areas for deposition of the stressor material, which will be doped to provide the deep source drain regions of the device.

Figure 3:
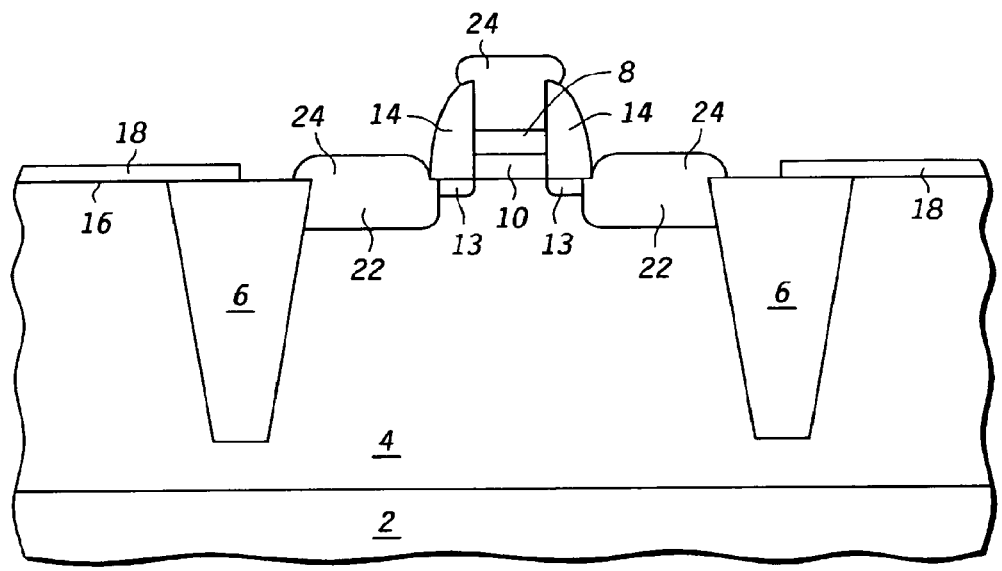

As shown in FIG. 3, the photoresist 20 is then removed and a semiconductor material 24 is formed in the recesses 22 such that it fills the recesses 22 and extends above the surface 16 of the epitaxial silicon layer 4. The semiconductor material 24 in the recesses is chosen such that it forms strained semiconductor regions 24 in the epitaxial silicon layer 4. The semiconductor material 24 thus preferably has a lattice spacing greater than the lattice spacing of the epitaxial silicon layer 4. The semiconductor material typically includes epitaxially grown silicon and germanium and boron and is deposited on the epitaxial silicon layer 4 in the recesses 22. If the polysilicon gate electrode 8 is etched, then the strained semiconductor material is also deposited on the polysilicon gate electrode 8.

Figure 4:
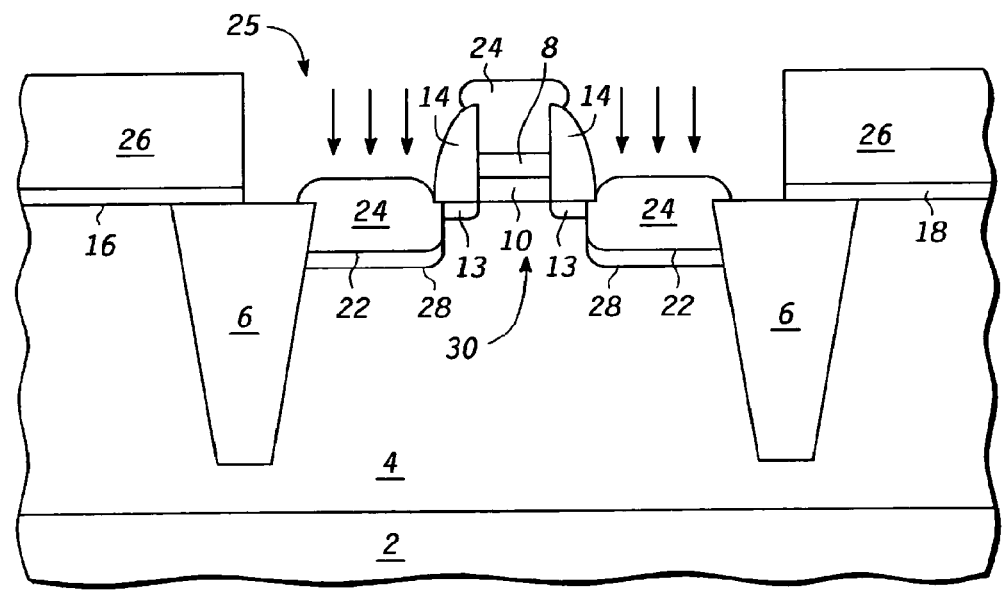

FIG. 4 shows the formation of the drain and source regions. A photoresist 26 is formed over the integrated circuit leaving openings 25 for the PMOS devices. A dopant, such as boron, is then implanted through the strained semiconductor regions 24 in the recesses 22 into the epitaxial silicon layer 24 to form source and drain regions 28.

In use of the PMOS device with a S/D stressor structure, a voltage can be applied over the source and drain regions 28. Current flows from the source region to the drain region through a channel 30 below the gate dielectric layer 10 when a voltage is applied to the gate electrode 8. As discussed above, the lattice of the strained semiconductor regions 24, comprising silicon and germanium, has a larger spacing than the spacing of the lattice of the epitaxial silicon layer 4 and because of this larger spacing, the strained semiconductor regions 24 create a compressive stress in the channel 30 which changes the mobility of the carriers in the channel. As discussed above, this has the advantageous effect of increasing the drive current.

The inventors of the subject application have investigated the effect of the structure of the S/D stressor structure on the junction leakage and have discovered that the positioning of the junction between the source and drain regions and the epitaxial silicon layer with respect to the interface between the strained semiconductor regions and the epitaxial silicon layer has a significant impact on the junction leakage current. As is well known, the junction leakage is the leakage from the junctions to a well.

Figure 5:
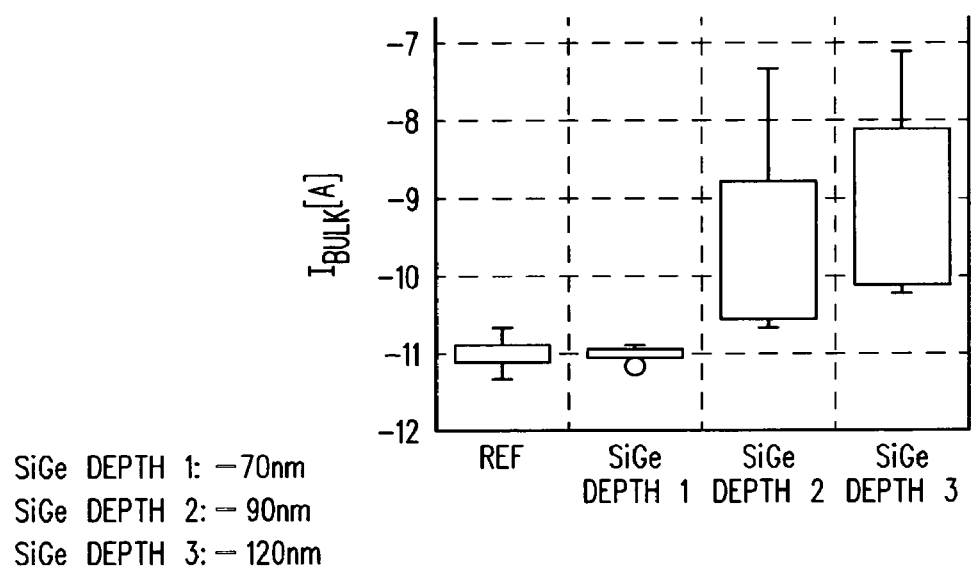
FIG. 5 is a graph showing the relationship between the depth of the strained semiconductor region in a semiconductor device and the leakage current.

FIG. 5 shows the junction leakage current Ibulk of a PMOS device with a S/D stressor structure for different depths of the recesses 22 (i.e. different depths of the strained SiGe regions 24 in the epitaxial silicon layer 4) when the implant process parameters are kept the same. The reference corresponds to a device without the strained SiGe regions 24. With depths 2 and 3 in FIG. 5, the source and drain junctions are formed in the strained SiGe regions and the junction leakage current is significantly increased. With depth 1, the source and drain junctions are formed in the epitaxial-silicon layer 4 below the strained SiGe regions and the leakage current is at the desired reference level.

Thus, from their investigations, the inventors have recognised that in order to reduce leakage current and hence wasted power, the source and drain regions should be formed below the strained regions.

Having deeper strained SiGe regions provide higher stress in the channel and so higher performance but too deep a strained region can create unacceptably high off-state leakage, which occurs only in the channel of the device between the source and drain and is due to the high fields in the channel between the source and drain junctions, and dispersion. Also, as the depth of the strained SiGe regions increases so does the depth of the implant required to form the source and drain regions below the strained SiGe regions since the dopants have to be implanted through deeper SiGe regions. Deeper implants cause the implanted junctions to be spread out. In order to maintain or improve device performance, shallower or more abrupt implanted junctions are desired.

A semiconductor device and a method of forming a semiconductor device in accordance with the present invention will now be described with reference further to FIGS. 6-9. Like components to those of FIGS. 1-4 are referenced by the same reference numeral plus the number 100.

Figure 6:
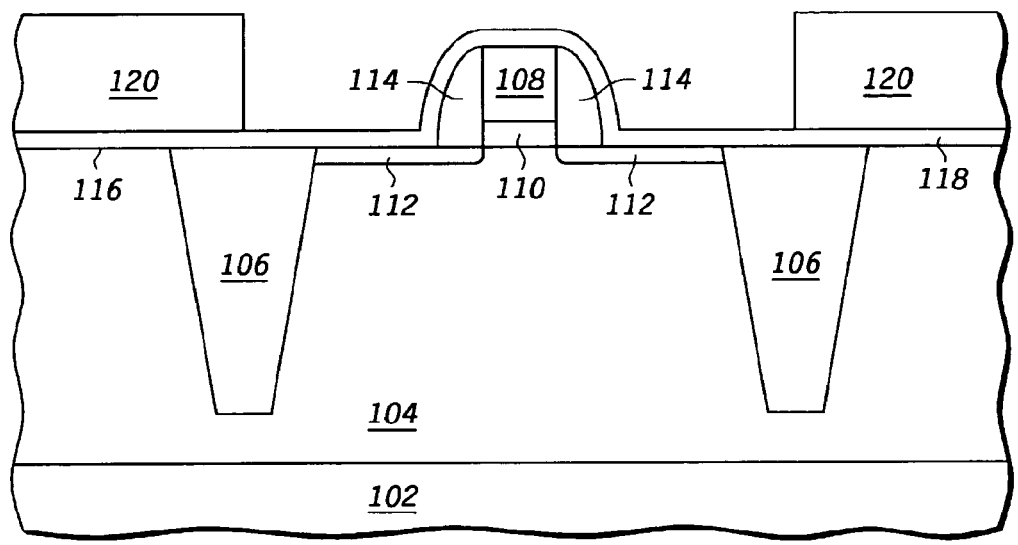
FIGS. 6-9 are cross-sectional side views of part of a semiconductor device during different stages of manufacture in accordance with one embodiment of the invention.

FIG. 6 shows a partially manufactured PMOS device of an integrated circuit (not shown) comprising a semiconductor layer 104, such as an epitaxial silicon layer or a silicon layer, formed on a substrate 102, such as a monocrystalline silicon substrate. The semiconductor layer 104 may be doped to form wells as is well known in the art. Isolation regions 106 are formed in the epitaxial silicon layer 104 to isolate wells of different conductivity types and to isolate adjacent transistors. Isolation regions 106 may be shallow trench isolation regions and may be formed of an oxide. A control electrode 108, which for a MOSFET device is the gate electrode, is formed over a portion of the epitaxial silicon layer 104 and formed on a gate dielectric layer 110, such as a nitrided oxide layer. The gate electrode 108 may be formed by deposition of polysilicon using known techniques.

Lightly doped or doped shallow regions 112 are formed in the epitaxial silicon layer 104 and are located on opposing sides of the gate electrode 108. These regions 112 are also known as lightly doped drain regions (a region 112 on one side of the gate electrode 108 is a lightly doped source region and a region 112 on the other side is a lightly doped drain region) or extension regions. For a PMOS device, the extension regions 112 may be formed by implanting boron ions into a surface 116 of the epitaxial silicon layer 104. Spacers 114 are formed on opposing sides of the gate electrode 108. The spacers 114 cover the sides of the gate electrode 108 and portions of the surface 116 of the epitaxial silicon layer 104. The spacers 114 may be nitride spacers and may be formed by well known techniques.

A hard mask 118, such as a 20 nm oxide mask, is formed, for example by PECVD, over the semiconductor device and photoresist 120 is then formed over the other non-PMOS devices on the integrated circuit.

Figure 7:
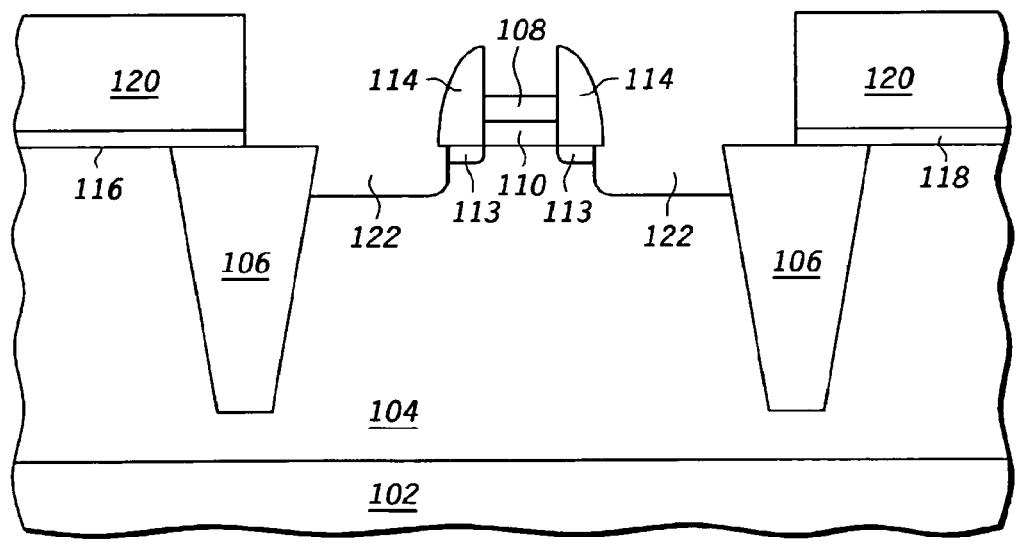

Referring now to FIG. 7, a selective etch step is then performed in order to form recesses 122 extending into the epitaxial silicon layer 104 from the surface 116 on opposing sides of the gate electrode 108. These recesses 122 define the source/drain stressor regions. An anisotropic etchant may be used which selectively removes the hard mask 118 and the epitaxial silicon layer 104 which are not covered with photoresist 120 to form recesses 122. In the process flow shown herein, the gate electrode 108 is also etched. In other process flows, however, a mask may be used such that the gate electrode may not be etched. The process parameters for the selective etch step are chosen such that the recesses extend between 60-100 nm from the surface 116 into the epitaxial silicon layer 104. In the embodiment shown in FIG. 7, inner edges of the recesses 122 undercut the outer edges of the spacers 114 and outer edges of the recesses 122 are aligned with the isolation regions 106. The exposed portions of the lightly doped drain regions 112 are also etched in the selective etch step to provide lightly doped drain (and source) regions 113.

Figure 8:
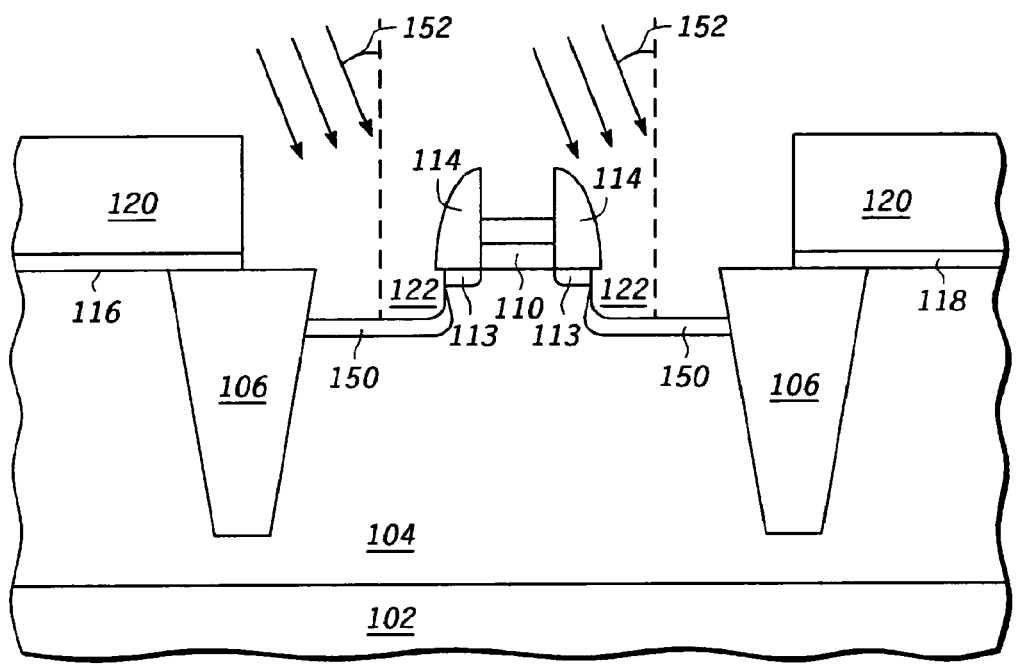

Doped regions 150 are then formed in the epitaxial silicon layer 104 through the recesses 122 such that each of the doped regions 150 extend into the epitaxial layer 104 from at least a base of the recess (see FIG. 8). The doped regions 150 form the current electrode regions of the semiconductor device: for MOSFET devices, these are the source and drain regions. The doped regions 150 may be formed by implanting a dopant, such as boron for PMOS devices, having a high dose, for example in the range of 1e15 cm.sup.-2 to 1e17 cm.sup.-2 and a low implant energy, for example, equal to or less than 1 keV. The implantation energy for implanting doped regions 150 is increased compared to the implantation energy used to form lightly doped regions 112 but is selected to be low so as to form shallow implanted regions 150, typically extending to a depth of 80 nm from the surface 116: shallow implants give better control over junction abruptness. The dopant ions may be implanted in a direction of implant at an angle 152 in the range of 0-15.degree. to a normal to the surface 116 of the epitaxial silicon layer 104. Implanting at a tilt angle is a well known technique. As is clear from simple geometry, implanting at an angle of say 10.degree. means that the junction between a doped region 150 and the epitaxial silicon layer 104 is further away from the vertical edge of a recess which, as discussed above, when the recess is filled with semiconductor material to become a strained region, helps reduce leakage current.

Figure 9:
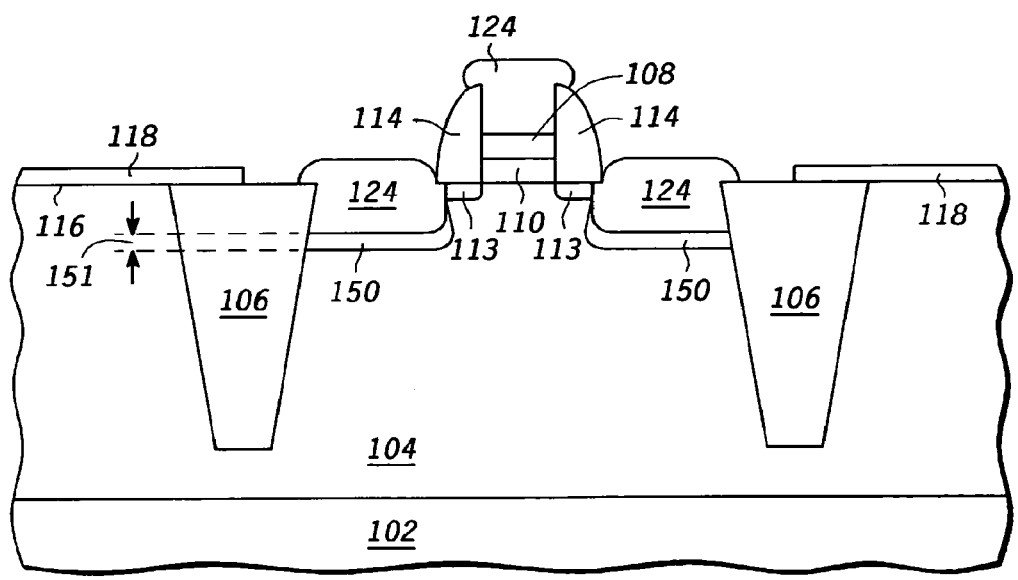

Referring now to FIG. 9, the photoresist 120 is then removed and a semiconductor material 124 is formed in the recesses 122 such that it fills the recesses 122 and in the embodiment shown in FIG. 9, extends above the surface 116 of the epitaxial silicon layer 104. The semiconductor material 124 in the recesses is chosen such that it forms strained semiconductor regions 124 in the epitaxial silicon layer 104. In an embodiment of the invention, the semiconductor material 124 has a lattice structure that is substantially the same as the lattice structure of the semiconductor layer 104 and has a lattice spacing or lattice constant (which is the distance between atoms in the lattice) different to the lattice spacing of the epitaxial silicon layer 104. The difference in lattice spacing should be large enough to create strain but not too large to create defects that relieve the strain. To induce a compressive strain for PMOS devices, the lattice spacing of the semiconductor material 124 is required to be greater than the lattice spacing of the semiconductor layer 104. Other factors may be considered when selecting the semiconductor material 124, for example, it is desirable that the semiconductor material 124 is compatible with the semiconductor layer 104 upon which it is deposited at the temperatures used in the semiconductor device fabrication process.

The semiconductor material 124 typically includes epitaxially grown silicon and germanium and boron, known as in-situ boron doped SiGe, and is formed by epitaxial deposition on the epitaxial silicon layer 104 in the recesses 122, for example, by a rapid thermal CVD process. Typically, the percentage of silicon used in the SiGe material 124 is 25-30%. The percentage is determined such that the addition of Ge to the Si changes the lattice constant sufficiently to create strain without creating defects that relieve the strain. When too much Ge is present, the lattice constant difference between the semiconductor layer 104 and the stressor semiconductor material 124 becomes so large that defects form to relieve the high stress induced by the lattice constant difference. Thus, the percentage of Si vs Ge is determined by the trade off between wanting high stress in the channel but not so high that defects form to relieve the stress and create leakage paths through the junction. Other semiconductor materials may also be used to fill recesses 122, such as undoped silicon and germanium or other combinations of III-IV semiconductor materials such as gallium and arsenide.

Instead of having an epitaxial silicon layer 104, the semiconductor layer 104 may comprises a conventional prime substrate, such as a silicon substrate. In this case, the stressor semiconductor material 124 may comprise silicon and germanium (or in-situ doped SiGe) epitaxially deposited on the silicon substrate.

If the polysilicon gate electrode 108 is etched, then the semiconductor material is also deposited on the polysilicon gate electrode 108.

The junction between the source and drain regions 150 and the epitaxial silicon layer 104 is formed a predetermined depth 151 below the interface between the strained semiconductor regions 124 and the epitaxial silicon layer 104. The predetermined depth is in the range of 5-10 nm and is determined by the energy used to form the source and drain regions 150 (i.e. the implant energy) and the contour of the recesses 122 through which the source and drain regions 150 are formed.

Other process steps then take, place to complete the formation of the PMOS device which are well known in the art, for example, thermal processes to activate the implanted materials, metallization to form the source, drain and gate electrodes.

By forming the source and drain regions before forming the strained semiconductor regions, the present invention ensures that the junction between the source and drain regions and the epitaxial silicon layer is below the interface between the strained semiconductor region and the epitaxial silicon layer. This has an advantage, as can be seen in FIG. 5 above, of reducing junction leakage which is particularly advantageous in low power applications. Furthermore, by forming the source and drain regions before forming the strained semiconductor regions, the present invention allows for the source and drain regions to be formed by a shallow implant which gives better control over the junction abruptness and hence improves device performance. Moreover, the present invention enables the depth of the strained semiconductor regions to be increased without requiring deeper implants in order to form the source and drain regions below the strained semiconductor regions. As discussed above, having deeper strained semiconductor regions increases the stress on the channel which increases charge mobility. Thus, the present invention enables the structure of a source/drain stressor PMOS device to be optimised to improve device performance.

By comparing the known process flow described above with respect to FIGS. 1-4 and the process flow in accordance with the invention described above with respect to FIGS. 6-9, the present invention uses the same photoresist 120 to form the recesses and the source and drain regions (see FIG. 8) whereas the prior art process flow requires an additional photoresist 26 (see FIG. 4) in order to form the source and drain regions. Thus, by avoiding the need for additional processing steps (e.g. photolithography), the present invention reduces the cost of manufacture of such strained devices.

A method in accordance with a second aspect of the invention will now be described with reference to FIGS. 10-12. Like components to those of FIGS. 6-9 are referenced by the same reference numeral plus 100.

Figure 10:
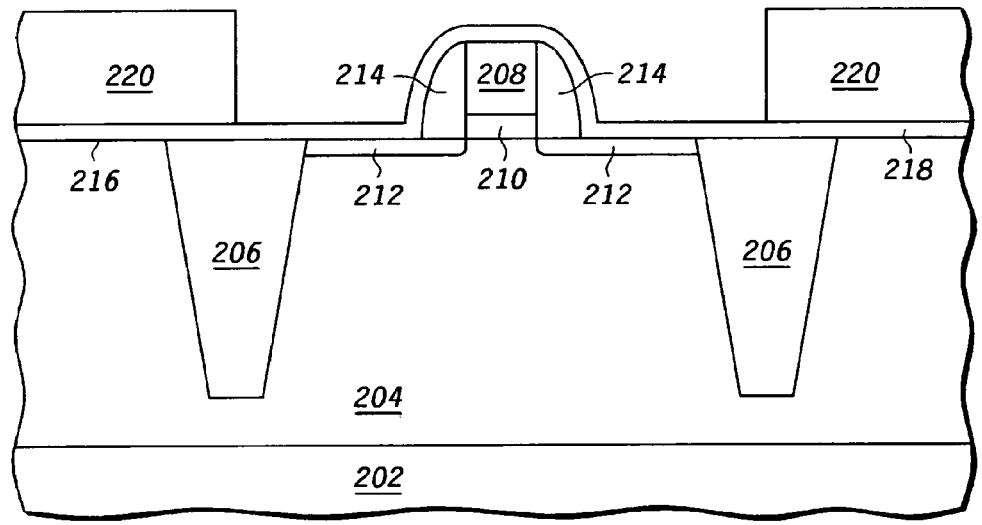
FIGS. 10-12 are cross-sectional side views of part of a semiconductor device during different stages of manufacture in accordance with another embodiment of the invention.

FIG. 10 shows a partially manufactured PMOS device of an integrated circuit (not shown) comprising a semiconductor layer 204, such as an epitaxial silicon layer or silicon layer, formed on a substrate 202, such as a monocrystalline silicon substrate. The semiconductor layer 204 may be doped to form wells as is well known in the art. Isolation regions 206 are formed in the epitaxial silicon layer 204 to isolate wells of different conductivity types and to isolate adjacent transistors. Isolation regions 206 may be shallow trench isolation regions and may be formed of an oxide. A control electrode 208, which for a MOSFET device is the gate electrode, is formed over a portion of the epitaxial silicon layer 204 and formed on a gate dielectric layer 210, such as a nitrided oxide layer. The gate electrode 208 may be formed by deposition of polysilicon using known techniques.

Lightly doped or doped shallow regions 212 are formed in the epitaxial silicon layer 204 and are located on opposing sides of the gate electrode 208. These regions 212 are also known as lightly doped drain regions (a region 212 on one side of the gate electrode 208 is a lightly doped source region and a region 212 on the other side is a lightly doped drain region) or extension regions. For a PMOS device, the extension regions 212 may be formed by implanting boron ions into a surface 216 of the epitaxial silicon layer 204. Spacers 214 are formed on opposing sides of the gate electrode 208. The spacers 214 cover the sides of the gate electrode 208 and portions of the surface 216 of the epitaxial silicon layer 204. The spacers 214 may be nitride spacers and may be formed by well known techniques.

A hard mask 218, such as a 20 nm oxide mask, is formed, for example by PECVD, over the semiconductor device and photoresist 220 is then formed over the other non-PMOS devices on the integrated circuit.

Figure 11:
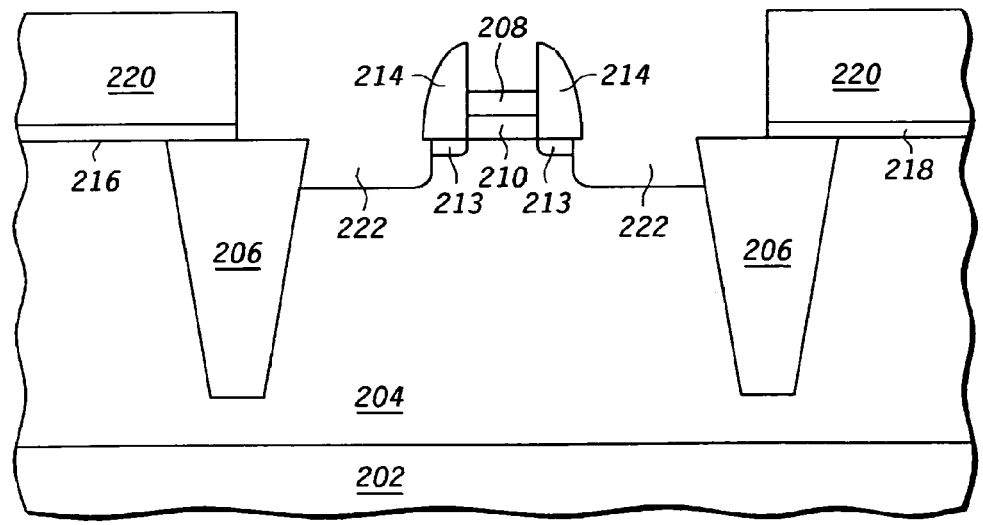

Referring now to FIG. 11, a selective etch step is then performed in order to form recesses 222 extending into the epitaxial silicon layer 204 from the surface 216 on opposing sides of the gate electrode 208. These recesses 222 define the source/drain stressor regions. An anisotropic etchant may be used which selectively removes the hard mask 218 and the epitaxial silicon layer 204 which are not covered with photoresist 220 to form recesses 222. In the process flow shown herein, the gate electrode 208 is also etched. In other process flows, however, a mask may be used such that the gate electrode may not be etched. The process parameters for the selective etch step are chosen such that the recesses extend between 60-100 nm from the surface 216 into the epitaxial silicon layer 204. In the embodiment shown in FIG. 11, the inner edges of the recesses 222 undercut the outer edges of the spacers 214 and outer edges of the recesses 222 are aligned with the isolation regions 206. The exposed portions of the lightly doped drain regions 212 are also etched in the selective etch step to provide lightly doped drain (and source) regions 213.

Figure 12:
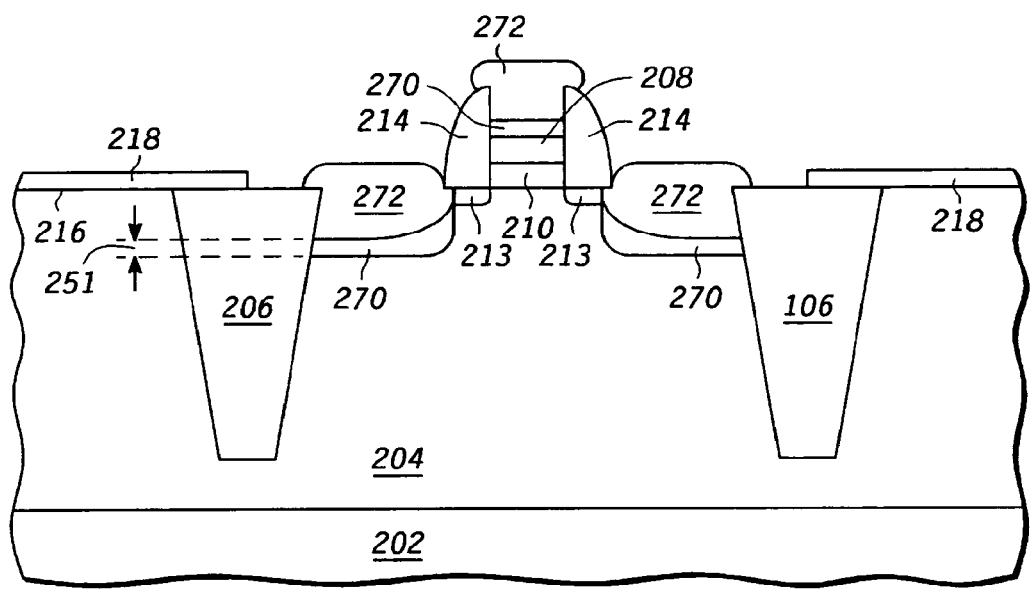

Referring now to FIG. 12, the photoresist 220 is then removed and a first layer 270 of a first semiconductor material doped with a dopant is formed in the recesses 222. The first semiconductor material typically includes epitaxially grown silicon and boron, known as in-situ boron doped silicon and is formed by epitaxial deposition on the epitaxial silicon layer 204 in the recesses 222 typically using a rapid thermal CVD process. Note, deposition also occurs on the side of the recesses 222 that are adjacent to the channel but does not occur on the sides of the recess that are adjacent to the isolation regions 206. In an embodiment, the first layer 270 has a thickness of 2-5 nm. The doped first layer 270 in each recess 222 forms a current electrode region 270 (e.g. source or drain region) of the device. Other semiconductor materials and dopants may be used in the first layer 270 to form the source and drain regions 270. For example, SiC for NMOS devices.

If the gate electrode 208 is etched, then the first semiconductor material is also deposited on the polysilicon gate electrode 208.

Then a second layer 272 of a second semiconductor material is formed in the recesses over the first layer 270 such that it fills the recesses 222 and in the embodiment shown in FIG. 12, extends above the surface 216 of the epitaxial silicon layer 204. The second semiconductor material of the second layer 272 is chosen such that it forms strained semiconductor regions 272 in the epitaxial silicon layer 204. In an embodiment according to the second aspect of the invention, the second semiconductor material has a lattice structure that is substantially the same as the lattice structure of the semiconductor layer 204 and has a lattice spacing or lattice constant (which is the distance between atoms in the lattice) different to the lattice spacing of the epitaxial silicon layer 204. The difference in lattice spacing should be large enough to create strain but not too large to create defects that relieve the strain. To induce a compressive strain for PMOS devices, the lattice spacing of the second semiconductor material is required to be greater than the lattice spacing of the semiconductor layer 204. Other factors may be considered when selecting the second semiconductor material, for example, it is desirable that the second semiconductor material is compatible with the semiconductor layer 204 upon which it is deposited at the temperatures used in the semiconductor device fabrication process.

The semiconductor material typically includes epitaxially grown silicon and germanium and boron, known as in-situ boron doped SiGe, and is formed by epitaxial deposition on the first layer 270 in the recesses 222, for example by a rapid thermal CVD process. Typically, the percentage of silicon used in the SiGe material is 25-30%. The percentage is determined such that the addition of Ge to the Si changes the lattice constant sufficiently to create strain without creating defects that relieve the strain. When too much Ge is present, the lattice constant difference between the semiconductor layer 204 and the second semiconductor material becomes so large that defects form to relieve the high stress induced by the lattice constant difference. Thus, the percentage of Si vs Ge is determined by the trade off between wanting high stress in the channel but not so high that defects form to relieve the stress and create leakage paths through the junction. Other semiconductor materials may also be used as the second layer 272, such as undoped silicon and germanium or other combinations of III-IV semiconductor materials such as gallium and arsenide.

Instead of having an epitaxial silicon layer 204, the semiconductor layer 204 may comprises a conventional prime substrate, such as a silicon substrate. In this case, the second semiconductor material may comprise silicon and germanium (or in-situ doped SiGe) epitaxially deposited on the silicon substrate.

The depth of the second layer will depend on the depth of the recess 222 and also the depth of the first layer 270. In an embodiment where the first layer 270 has a depth 5 nm and the recess has a depth of 70 nm, the second layer 272 will have a depth of 65 nm.

If the gate electrode 208 is etched, then the second semiconductor material is also deposited on the first semiconductor material on the polysilicon gate electrode 208.

The junction between the source and drain regions 270 and the epitaxial silicon layer 204 is formed a predetermined depth 251 below the interface between the strained semiconductor regions 272 and the epitaxial silicon layer 204. The predetermined depth 251 is dependent on the depth of the first layer 270: thus, when the depth of the first layer 270 is 5 nm, the predetermined depth is 5 nm.

Other process steps then take place to complete the formation of the PMOS device which are well known in the art, for example, metallization to form the source, drain and gate electrodes.

The second aspect of the present invention thus forms the source and drain regions before forming the strained semiconductor regions by means of using a two step process to deposit the first and second layers of different materials in the recesses. Thus, as with the first aspect of the invention, the second aspect of the present invention ensures that the junction between the source and drain regions and the epitaxial silicon layer is below the interface between the strained semiconductor region and the epitaxial silicon layer. As discussed above, this has an advantage of reducing junction leakage which is particularly advantageous in low power applications. Moreover, the present invention enables the depth of the strained semiconductor regions to be increased without requiring deeper implants in order to form the source and drain regions below the strained semiconductor regions. As discussed above, having deeper strained semiconductor regions increases the stress on the channel which increases charge mobility. Thus, the present invention enables the structure of a source/drain stressor PMOS device to be optimised to improve device performance.

Since the second aspect of the present invention forms the source and drain regions by depositing the first layer comprising semiconductor material doped with a dopant rather than by implantation, the source and drain regions formed in accordance with the second aspect of the present invention have a step-shaped cross-section and thus, a junction can be formed that is more abrupt than any junction formed by implantation. A more abrupt junction is desirable since it increases device performance.

In an embodiment of the second aspect of the invention, the first layer comprising semiconductor material doped with a dopant is deposited on the epitaxial silicon layer 204. Depositing semiconductor material on an un-implanted surface is easier than depositing semiconductor material on a surface in which dopants have been implanted. Thus, the second aspect of the invention simplifies the manufacturing process compared to forming the strained SiGe regions on an implanted surface and will not have the complication of defects and amorphization created when using implants to form the junction.

The present invention has been described with reference to a PMOS device. An NMOS device may be manufactured in a similar manner. In an NMOS device, doping conductivity types would be reversed. For example, phosphorous or arsenic could be used as the dopant for doped regions 112 and 150. Furthermore, a tensile stress will be created in the channel using strained semiconductor regions comprising, for example, silicon and carbon. In the NMOS case, the semiconductor material to be deposited in the recesses is selected such that its lattice structure is the same as the lattice structure of the semiconductor layer which forms the channel and its lattice spacing is less than the lattice spacing of the semiconductor layer which forms the channel.

What is claimed is:

1. A semiconductor device comprising:
   a semiconductor layer having a control electrode over a portion of the semiconductor layer;
   a first strained semiconductor region formed adjacent to the control electrode to strain the semiconductor layer under the control electrode; and
   a current electrode comprising a first doped region adjacent to the control electrode extending a predetermined depth below a lowest point of an interface between the semiconductor layer and the first strained semiconductor region by an amount in the range of five to ten nanometers.

2. The device of claim 1, wherein the first strained region comprises a lattice structure that is the same as the semiconductor layer but that has a different lattice spacing than the semiconductor layer.

3. The device of claim 2, wherein the lattice structure of the first strained region comprises silicon and germanium, and the semiconductor layer comprises silicon, but not germanium.

4. The device of claim 2, wherein the first doped region is formed by implanting a dopant having a low implant energy.

5. The device of claim 4, wherein the low implant energy is less than or equal to 1 keV.

6. The device of claim 5, wherein implanting the dopant further comprises implanting a dopant having a high dose.

7. The device of claim 5, wherein implanting the dopant further comprises implanting a dopant having a dose in the rage of $1e15e^{-2}$ to $1e17e^{-2}$.

8. The device of claim 2, wherein implanting the dopant further comprises implanting a dopant having a dose in the rage of $1e15e^{-2}$ to $1e17e^{-2}$.

9. The device of claim 2, wherein the first doped region is formed by implanting a dopant having a low implant energy that is greater than an implant energy used to form a lightly doped extension region.

10. The device of claim 1, wherein the first doped region is an epitaxial grown doped layer.

11. The device of claim 1, wherein the first doped region is an epitaxial grown doped layer comprising silicon, but not germanium.

12. A semiconductor device comprising:
    a semiconductor layer having a control electrode over a portion of the semiconductor layer;
    a first strained semiconductor region formed adjacent to the control electrode to strain the semiconductor layer under the control electrode; and
    a current electrode comprising a first doped region adjacent to the control electrode extending below a lowest point of the first strained semiconductor region, and formed by a dopant having an implant energy of less than or equal to 1 keV.

13. The device of claim 12, wherein the current electrode has a depth of five to ten nanometers.

14. The device of claim 13, wherein the dopant has a high dose.

15. The device of claim 13, wherein forming the dopant comprises implanting a dose of the dopant the rage of $1e15e^{-2}$ to $1e17e^{-2}$.

16. The device of claim 12, further comprising a lightly doped extension region formed by a dopant having a lower implant energy than the first doped region.

17. The device of claim 16, wherein the low implant energy is less than or equal to 1 keV.

18. The device of claim 16, wherein an uppermost portion of the first doped region is below a lowermost portion of the lightly doped extension regions, wherein the uppermost portion of the first doped region is at a level of the device that is between the lowermost portion of the first doped region and the lowermost portion of the lightly doped extension regions.

19. The device of claim 18, wherein implanting the dopant further comprises implanting a dopant having a dose in the rage of $1e15e^{-2}$ to $1e17e^{-2}$.

20. The device of claim 13, wherein implanting the dopant further comprises implanting a dopant having a dose in the rage of $1e15e^{-2}$ to $1e17e^{-2}$.

\* \* \* \* \*